(12) United States Patent
Sato (10) Patent No.: US 8,647,558 B2
(45) Date of Patent: Feb. 11, 2014

(54) METHOD FOR MANUFACTURING STRUCTURE

(75) Inventor: Tamaki Sato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 766 days.

(21) Appl. No.: 12/778,688

(22) Filed: May 12, 2010

(65) Prior Publication Data

US 2010/0310990 A1 Dec. 9, 2010

(30) Foreign Application Priority Data

Jun. 3, 2009 (JP) .................................. 2009-134075

(51) Int. Cl.
*B29C 35/08* (2006.01)

(52) U.S. Cl.
USPC ........................................................ 264/496

(58) Field of Classification Search
USPC .......................................... 264/496; 425/385
See application file for complete search history.

(56) References Cited

U.S. PATENT DOCUMENTS

| | | | |
|---|---|---|---|
| 6,334,960 B1 | 1/2002 | Wilson et al. | |
| 7,629,111 B2 | 12/2009 | Kubota et al. | |
| 2002/0093119 A1* | 7/2002 | Morales | 264/225 |
| 2006/0277755 A1 | 12/2006 | Kubota et al. | |
| 2007/0252872 A1 | 11/2007 | Fujii et al. | |
| 2008/0182081 A1* | 7/2008 | Jeon et al. | 428/195.1 |
| 2008/0227035 A1 | 9/2008 | Kanri et al. | |
| 2009/0133256 A1 | 5/2009 | Okano et al. | |
| 2009/0136875 A1 | 5/2009 | Kubota et al. | |
| 2009/0167812 A1 | 7/2009 | Asai et al. | |
| 2009/0229125 A1 | 9/2009 | Kato et al. | |
| 2013/0187312 A1* | 7/2013 | Pauliac et al. | 264/447 |

FOREIGN PATENT DOCUMENTS

| | | |
|---|---|---|
| JP | 2003-272998 A | 9/2003 |
| JP | 2004-304097 A | 10/2004 |
| JP | 2005-354017 A | 12/2005 |

OTHER PUBLICATIONS

English translation of Japanese Laid-Open Patent Application No. 2003-272998.
English translation of Japanese Laid-Open Patent Application No. 2004-304097.
English translation of Japanese Laid-Open Patent Application No. 2005-354017.
Chou et al., "Nanoimprint lithography", J. Vac. Sci. Technol. B 14(6), Nov./Dec. 1996, pp. 4129-4133.
Bailey et al., "Step and flash imprint lithography: Template surface treatment and defect analysis", J. Vac. Sci. Technol. B 18(6), Nov./Dec. 2000, pp. 3572-3577.

* cited by examiner

*Primary Examiner* — Ryan Ochylski
(74) *Attorney, Agent, or Firm* — Fitzpatrick, Cella, Harper & Scinto

(57) ABSTRACT

A method for manufacturing a structure includes, in the following order, preparing a substrate having a positive-type photosensitive resin layer and an absorption layer stacked thereon in this order, the absorption layer being capable of absorbing a light having a photosensitive wavelength which the positive-type photosensitive resin senses; pressing a projecting portion of a mold into both the positive-type photosensitive resin layer and the absorption layer; separating the mold from both layers; irradiating the two layers with the light from an upper face side of both layers; removing the absorption layer; and developing the positive-type photosensitive resin layer.

8 Claims, 5 Drawing Sheets

METHOD FOR MANUFACTURING STRUCTURE

BACKGROUND OF THE INVENTION

1. Field of the Invention

The present invention relates to a method for manufacturing a fine structure with the use of an imprint due to a mold having an uneven pattern.

2. Description of the Related Art

Figure 4A:
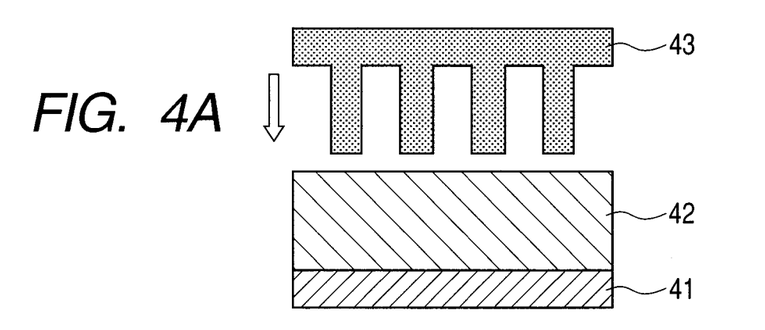
FIGS. 4A, 4B, 4C and 4D are schematic sectional views illustrating a basic embodiment of a method for forming a fine structure in a conventional example.
Figure 4B:
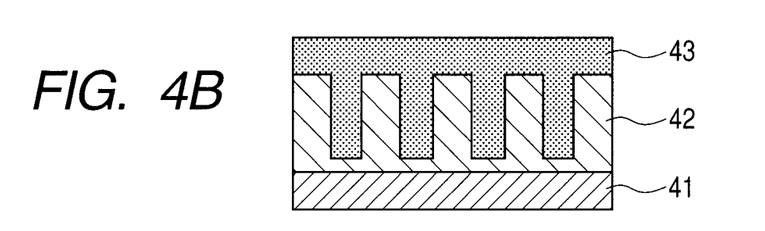
Figure 4C:
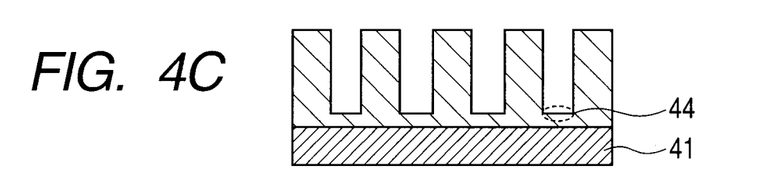
Figure 4D:
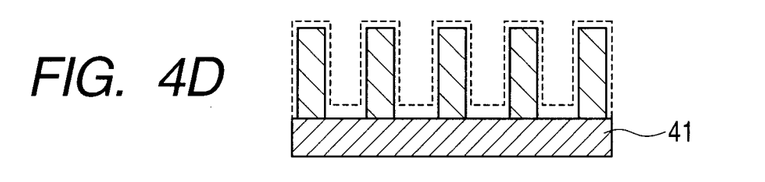

As for the method for manufacturing the fine structure, a technique referred to as a nanoimprint method is described in S. Y. Chou et al., "Nanoimprint lithography", J. Vac. Sci. Technol. B 14(6), November/December 1996, pp 4129-4133. The method described in this literature will be described below with reference to FIGS. 4A to 4D. Firstly, a resist 42 is applied on a surface of a substrate 41 (FIG. 4A). The substrate 41 is heated to a glass transition point temperature or higher of the resist 42, and a mold 43 having a desired uneven pattern formed thereon is pressed onto the softened resist 42 by heating. (FIG. 4B). The temperature of the substrate 41 is decreased to the glass transition temperature of the resist 42 or lower, in a state in which the mold 43 is pressed into the resist 42, and after that, the mold 43 is released from the resist 42 (FIG. 4C). At this time, a residual film 44 of the resist remains in a region in which the resist has been pressed by a salient pattern portion of the mold 43. The residual film 44 of the resist is usually removed, for instance, by ECR (Electron Cyclotron Resonance) etching and the like. By the above described etching, a desired resist pattern can be obtained (FIG. 4D).

Furthermore, a method for forming a pattern by irradiating a photo-curable resin with a light in a state in which a quartz mold is pressed onto the photo-curable resin and curing the photo-curable resin is described in T. Bailey et al., "Step and flash imprint lithography: Template surface treatment and defect analysis", J. Vac. Sci. Technol. B 18(6), November/December 2000, pp. 3572-3577. In this case, an etched layer is formed on the substrate beforehand, and a residual film of the photo-curable resin and the etched layer are etched by plasma etching, while using a pattern which has been formed by an imprint as a mask. This method is generally referred to as a photo imprint, and shows an effect of reducing the misalignment of the pattern, because of not needing to increase the temperature of the substrate to a high temperature by using the photo-curable resin.

A conventional imprint method is a mechanical processing method for a resist, so a residual film of the resist is formed in a region of having been pressed by the mold, as in the above described example. This residual film of the resist needs to be removed by a technique such as dry etching. For instance, U.S. Pat. No. 6,334,960 describes a method for removing the residual film (residual material) remaining there after the imprint operation, by exposing the residual film under an environment of an argon ion flow, a fluoride-containing plasma, a reactive ion etching gas or a mixture thereof.

In addition, Japanese patent Application Laid-Open No. 2003-272998, Japanese patent Application Laid-Open No. 2004-304097 and Japanese patent Application Laid-Open No. 2005-354017 describe the following imprint method. Firstly, a light-shielding film or a light-shielding portion is formed on a projecting portion of a quartz mold, and the photo-curable resin is selectively irradiated with an irradiation light in a state in which the mold is pressed onto the photo-curable resin. After this, the residual film at a projecting portion of the mold having the light-shielding film is removed by developing the photo-curable resin, and consequently the pattern is imprinted.

However, when the residual film of the resist is removed by the technique such as dry etching as is described in U.S. Pat. No. 6,334,960, it is considered that the shape of the resist pattern is deteriorated or the dimensional controllability is deteriorated like a supposed figure illustrated in FIG. 4D. In other words, a pattern shape (dotted line portion in FIG. 4D) having existed before the dry etching step retreats due to etching. In order to remove the residual film of the resist while retaining a necessary line width and shape of a pattern as much as possible, an etching method having a high anisotropy has been employed, which has caused a problem of increasing an etching treatment period of time. These problems become more remarkable as a desired pattern becomes more complicated and refined.

Methods described in Japanese patent Application Laid-Open No. 2003-272998, Japanese patent Application Laid-Open No. 2004-304097 and Japanese patent Application Laid-Open No. 2005-354017 have the following concerns. Firstly, the concern is a point that an apparatus for working a mold becomes very expensive, and a capital investment increases because the mold is made from quartz. The concern is also a point that a process for forming the mold becomes complicated because the light-shielding film is provided on the projecting portion of the mold.

SUMMARY OF THE INVENTION

For this reason, an object of the present invention is to provide a method which can form a fine pattern without degrading the accuracy of line width and the shape of the resist pattern, when removing a residual film of the pattern which has been obtained by pressing the mold.

In order to achieve the above described object, a method for manufacturing a structure according to the present invention includes the followings in this order: preparing a substrate having a positive-type photosensitive resin layer and an absorption layer that can absorb a light having a photosensitive wavelength which the positive-type photosensitive resin senses stacked thereon in this order; pressing a projecting portion of a mold having the projecting portion into two layers of the positive-type photosensitive resin layer and the absorption layer; separating the mold from the two layers; irradiating the two layers with the light from an upper face side of the two layers; removing the absorption layer; and developing the positive-type photosensitive resin layer.

The method according to the present invention can control a pattern shape of a fine structure with higher accuracy because the imprinted pattern is not degraded by residual film treatment.

Further features of the present invention will become apparent from the following description of exemplary embodiments with reference to the attached drawings.

BRIEF DESCRIPTION OF THE DRAWINGS

FIGS. 5A, 5B, 5C, 5D, 5E, 5F, 5G, 5H, 5I and 5J are schematic sectional views illustrating a basic embodiment of a method for manufacturing an ink jet recording head according to the present invention.

DESCRIPTION OF THE EMBODIMENTS

Preferred embodiments of the present invention will now be described in detail in accordance with the accompanying drawings.

The present invention will be described in detail below with reference to the drawings.

Embodiment 1

Figure 1A:
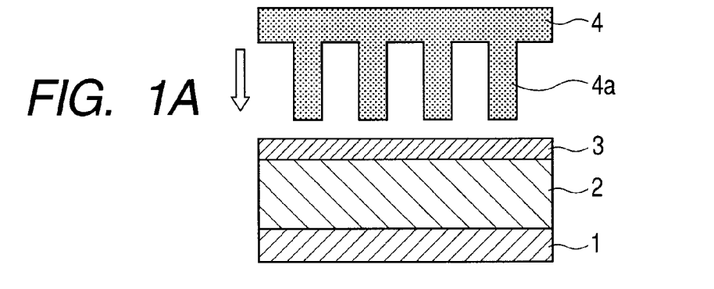
FIGS. 1A, 1B, 1C, 1D, 1E and 1F are schematic sectional views illustrating a basic embodiment of a method for forming a fine structure according to the present invention.

Firstly, as is illustrated in FIG. 1A, a substrate 1 is prepared in which a positive-type photosensitive resin layer 2 and an absorption layer 3 that can absorb a light having a photosensitive wavelength which the positive-type photosensitive resin senses are stacked in this order. This is prepared by forming the positive-type photosensitive resin layer 2 by depositing the positive-type photosensitive resin on the substrate 1, and forming the absorption layer 3 on the positive-type photosensitive resin layer 2 by depositing, for instance, a photosensitive resin which is a material for forming the absorption layer (FIG. 1A).

The absorption layer in the present invention absorbs a light having a wavelength in a wavelength range which a material that forms the positive-type photosensitive resin layer 1 senses. The absorption layer can employ a material which does not allow any light to pass through, but may allow a portion of the light to pass through as long as the layer can absorb the rest.

In addition, a photosensitive resin for forming the absorption layer 3 can be, for instance, a positive type photoresist containing a novolak resin and a naphthoquinone diazide derivative. A usable specific example is a conventional naphthoquinone-based positive type photoresist such as OFPR-800 (trade name) and THMR-iP5700 (trade name) which are commercially available from TOKYO OHKA KOGYO CO., LTD.

The usable material for forming the positive-type photosensitive resin layer 2 is not limited in particular as long as the material is a positive-type photosensitive resin, but includes, for instance, a main-chain decomposing-type positive-type resist. The main-chain decomposing-type positive-type resist includes, for instance, a main-chain decomposing-type positive-type resist of a high polymer which contains polymethyl isopropenyl ketone or a methacrylic acid ester as a main component. Furthermore, the main-chain decomposing-type positive-type resist of the high polymer which contains the methacrylic acid ester as a main component includes, for instance: a homopolymer such as polymethyl methacrylate and polyethyl methacrylate; and a copolymer of methyl methacrylate with methacrylic acid, acrylic acid, glycidyl methacrylate, phenyl methacrylate or the like.

The film-thickness of the positive-type photosensitive resin layer 2 can be set, for instance, at 3 to 20 μm and particularly can be set at 4 to 10 μm.

The film-thickness of the absorption layer 3 can be set, for instance, at 2 to 10 μm, and particularly can be set at 3 to 5 μm.

Figure 1B:
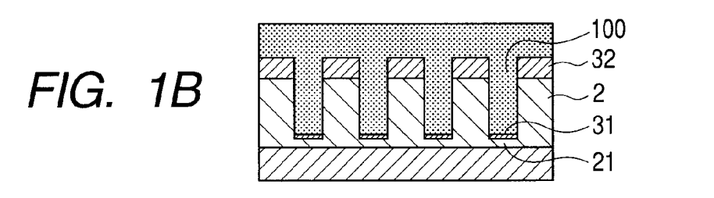

Next, two layers consisting of the positive-type photosensitive resin layer 2 and the absorption layer 3 are collectively imprinted by pressing a mold 4 having a desired salient pattern 4a onto the two layers (FIG. 1B).

The imprinting method includes, for instance, heating the substrate 1 at a temperature higher than glass transition points of the positive-type photosensitive resin and a photosensitive resin, and pressing the projecting portion 4a of the mold 4 against the two layers composed of the positive-type photosensitive resin layer 2 and the absorption layer 3.

The imprinting method also includes pressing the mold 4 so that the thickness of the absorption layer 21 in a recess portion 100 which is formed by the pressing of the mold 4 can become a film thickness through which the irradiating light passes in a posterior step, or less.

Figure 1C:
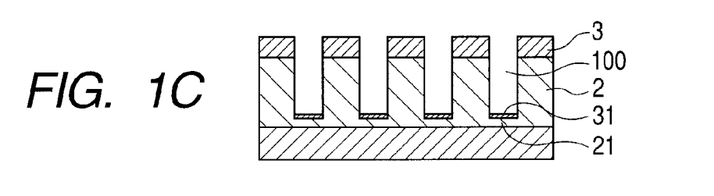

Next, the mold 4 is released from the two layers (FIG. 1C).

When the mold 4 is to be released from the layers, the temperature of the substrate 1 is decreased, for instance, to a temperature lower than the above described glass transition points, and then the mold 4 can be released from the layers.

When the mold is released, a residual film portion 31 of the absorption layer remains in the recess portion 100 corresponding to the projecting portion of the mold 4 in the uneven pattern on the two layers, and a residual film portion 21 of the positive-type photosensitive resin layer remains on the head of the residual film portion 31. The absorption layer 31 of the recess portion becomes thinner than the upper absorption layer 32 (a portion corresponding to a root of the projecting portion 4a of the mold 4) which remains on the upper layer of the pressed positive-type photosensitive resin layer 2. The reason why the absorption layer 31 of the recess portion becomes thinner than the upper absorption layer 32 is considered to be because the resin layer is compressed by pressing, or because the photosensitive resin is stretched by the wall face of the recess portion and the resin amount of the bottom face of the recess portion is reduced, but the present invention is not limited by these guesses in particular.

The absorption layer 31 of the recess portion becomes thinner than the film thickness having shielding properties to the irradiating light. The film-thickness of the absorption layer 31 of the recess portion can be set, for instance, at 0 or more and 1 μm or less, and further can be set at 0.5 μm or less. The film-thickness of the positive photosensitive resin layer 21 of the recess portion can be set at 0 or more and 3 μm or less, and further can be set at 1 μm or less.

On the other hand, the thickness of the upper absorption layer can be set at 2 to 10 μm, and further can be set at 3 to 5 μm.

Figure 1D:
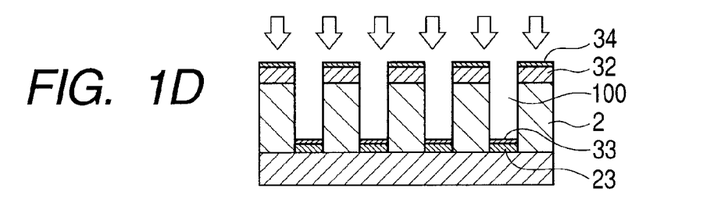

Next, the uneven pattern formed as in FIG. 1D is irradiated with a light containing a wavelength range which the positive-type photosensitive resin layer 2 senses (FIG. 1D).

At this time, the positive-type photosensitive resin layer 2 of the projecting portion in the lower side (substrate side) of the upper absorption layer 32 does not sense the light, because the upper absorption layer 32 has such a film thickness as to absorb the irradiating light and as not to allow the irradiating light to pass down to the positive-type photosensitive resin layer 2. On the other hand, the positive-type photosensitive resin layer 21 of the recess portion in the lower side of the absorption layer 31 of the recess portion senses the light, because the absorption layer 31 has a thinner film thickness than the film thickness having the shielding properties to the irradiating light as was described above (FIG. 1D). When the positive-type photosensitive resin is a main-chain decomposing type, the main chain decomposes by sensing the light.

The absorption layer 31 of the recess portion also senses an irradiating light. In the upper absorption layer 32, only the upper portion (34) senses light (FIG. 1D).

This exposure step may be conducted in a state which is illustrated in FIG. 1B. If the state would be described more in detail, the layers may be exposed to light in a state in which the mold is pressed (FIG. 1B), or may be exposed to light after the mold has been released.

The light shall irradiate the whole pattern, and the light may be a parallel light.

Figure 1E:
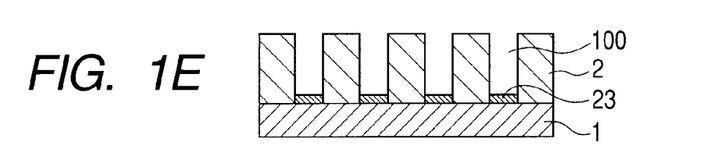

Next, the exposed absorption layer 33 of the recess portion and upper absorption layer 32 (containing the exposed portion 34) are removed with a removing liquid (FIG. 1E).

Figure 1F:
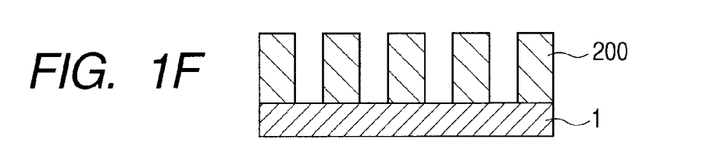

Next, the positive-type photosensitive resin layer 23 on the head of the exposed recess portion is removed with a developing liquid, and thereby a fine structure 200 is completed (FIG. 1F).

The above described forming method has a merit even when being compared with a method of forming a fine pattern with photolithography. In other words, a method of forming a pattern equivalent to that in the present invention by using a photomask needs to irradiate a photoresist with (light) energy necessary for making the photoresist sense the light. However, in the method according to the present invention, the layers may be irradiated with energy having a necessary quantity only for being capable of removing a portion (positive-type resin layer of recess portion) in which the layer has remained as a residual film.

In addition, when a photomask and a photoresist are vicinity-exposed (proximity-exposed) to light, the resolution of the pattern is aggravated by the influence of the diffracted light in the photomask. However, in the present invention, the photosensitive resin layer for shielding light works as a mask, which constitutes the same principle as, so to speak, contact exposure. Because of this, the resolution of the pattern becomes satisfactory, and LER (line edge roughness) and LWR (line wall roughness) also become satisfactory. This means that the method can directly make use of an original advantage of the imprint, which is a great advantage with respect to the photolithography.

The present invention is a useful technology in an MEMS (Micro Electro Mechanical Systems) field, in addition to a field of manufacturing a semiconductor such as an IC substrate. In the MEMS field, in particular, the method can be utilized as a useful method for manufacturing an ink jet recording head, a hard disk drive head and the like.

The present invention will be described in detail below with reference to examples. However, the present invention is not limited to the following examples.

Example 1

Firstly, a positive-type photosensitive resin 2 was formed by applying polymethyl isopropenyl ketone as a positive-type photosensitive resin onto an Si substrate with a spin coating technique. The thickness of the film formed after having been applied was 10 µm. Subsequently, an absorption layer 3 of 4 µm was formed by applying a positive resist OFPR-800 (trade name) made by TOKYO OHKA KOGYO CO., LTD. as a photosensitive resin onto the positive-type photosensitive resin with a spin coating technique (FIG. 1A).

Here, a mold having an uneven shape formed on Si was prepared as a mold 4. The depth of the unevenness was 15 µm, and the pitch of the pattern was 12 µm (a width of the projecting portion of 5 µm and a width of the recess portion of 7 µm).

Next, the Si substrate 1 was heated to 150° C., and was pressed and imprinted with the Si mold 4 (FIG. 1B).

The layers were imprinted by using a nanoimprint apparatus made by MEISYO KIKO Co., Ltd., and were pressed with a press pressure of 70 MPa.

The temperature of the substrate was cooled to 40° C. in the above described nanoimprint apparatus, and the mold was released (FIG. 1C).

Next, the whole surface was exposed with 6,000 mJ/cm$^2$ by using a Deep-UV aligner (UX-3000SC made by USHIO INC.) that can emit a light in a wavelength range which polymethyl isopropenyl ketone senses (FIG. 1D). At this time, the film thickness of an absorption layer 31 of the recess portion became as thin as 0.3 µm, so the energy of light used for exposure passed through the absorption layer 31, and a positive-type photosensitive resin layer 21 of the recess portion sensed the light. On the other hand, an upper absorption layer 32 was as sufficiently thick as 3 µm, and accordingly did not allow the light to pass through the upper absorption layer 22 which is positioned in the lower portion of the upper absorption layer 32.

Next, a fine structure 200 could be formed by operations of stripping OFPR-800 off (by using a mixture liquid having the following composition as a stripping liquid) (FIG. 1E), and developing polymethyl isopropenyl ketone (by using methyl isobutyl ketone as a developing liquid) (FIG. 1F).

<Composition of Stripping Liquid>
Diethylene glycol monobutyl ether 60 vol %
Ethanol amine 5 vol %
Morpholine 20 vol %
Ion-exchanged water 15 vol %

The formed fine structure had the pattern height of 18 µm, and the pattern pitch of 12 µm (a width of the projecting portion of 7 µm and a width of the recess portion of 5 µm).

The fine structure which has been produced in the present example has no residual film, and accordingly can be used as a permanent structure of a MEMS and the like, as in the state. Furthermore, a hollow structure can be formed also by operations of stacking another structure on this structure, and then eluting the previous structure.

Example 2

In the present example, a positive-type photosensitive resin layer 2 was formed in a similar way to that in Example 1. In addition, an absorption layer of 4.5 µm was formed by using a positive resist THMR-iP5700 (trade name) made by TOKYO OHKA KOGYO CO., LTD., as a photosensitive resin, and applying the photosensitive resin with a spin coating technique.

The same mold as in Example 1 was used as the mold 4, and the same imprint apparatus and the same conditions as in Example 1 were employed.

In the light irradiation operation to be conducted in FIG. 1D, a Deep-UV aligner (UX-3000SC) provided with an optical filter which shields a light having the wavelength of 290 nm to 400 nm was used, and the whole surface was exposed to a light of 5,000 mJ/cm$^2$.

Subsequently, operations similar to those in Example 1 were conducted to form a fine structure.

As a result, a fine structure 200 equivalent to that of Example 1 was formed.

Example 3

In the present example, a positive-type photosensitive resin layer 2 was formed by operations of using a copolymer of methyl methacrylate and methacrylic acid (monomer composition ratio=90:10) as a positive-type photosensitive resin, and applying the copolymer with a spin coating technique so that the film thickness could be 5 µm. In addition, the photosensitive resin layer was formed in a similar way to that in Example 1.

A used mold 4 had the depth of the unevenness of 8 µm and the pitch of 8 µm (a width of the projecting portion of 4 µm and a width of recess portion of 4 µm). The used imprint apparatus was the same nanoimprint apparatus made by MEISYO KIKO Co., Ltd.

In the present example, the substrate 1 was heated to the temperature of 170° C., and the imprint was formed with a press pressure of 70 MPa. The mold was released after having been similarly cooled to 40° C.

After that, steps of irradiating the whole surface with the use of the Deep-UV aligner, stripping and developing the layers were conducted on the same conditions as in Example 1.

As a result, a fine structure was formed on an Si substrate 1, which had the height of the pattern of 10 µm and the pitch of the pattern of 8 µm (a width of the projecting portion of 4 µm and a width of the recess portion of 4 µm).

Example 4

In the present example, a positive-type photosensitive resin 2 was formed by operations of using a copolymer of methyl methacrylate and methacrylic acid (monomer composition ratio=90:10) as a positive-type photosensitive resin, and applying the copolymer (5 µm) onto a substrate. Then, an absorption layer 3 was formed thereon by operations of using THMR-iP5700 as a photosensitive resin and applying the THMR-iP5700 (4.5 µm) onto the positive-type photosensitive resin 2.

Operations of molding and imprinting were conducted on the same conditions as in Example 3. Operations of irradiating the whole surface with the use of a Deep-UV aligner, stripping and developing the layers were conducted on the same conditions as in Example 2. As a result, a fine structure equivalent to that of Example 3 was formed.

Example 5

Figure 2A:
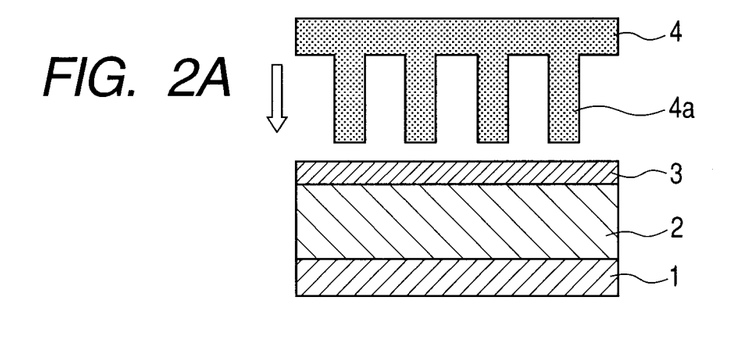
FIGS. 2A, 2B and 2C are schematic sectional views illustrating a basic embodiment of a method for forming a fine structure according to the present invention.
Figure 2B:
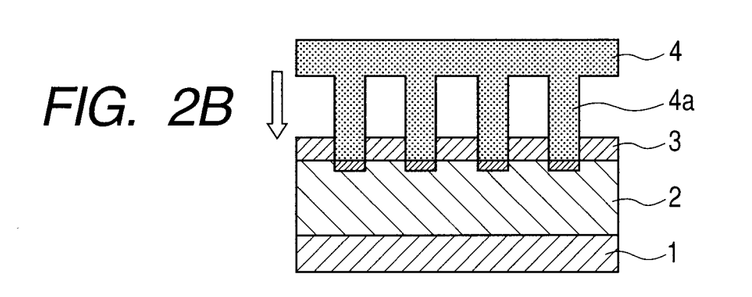
Figure 2C:
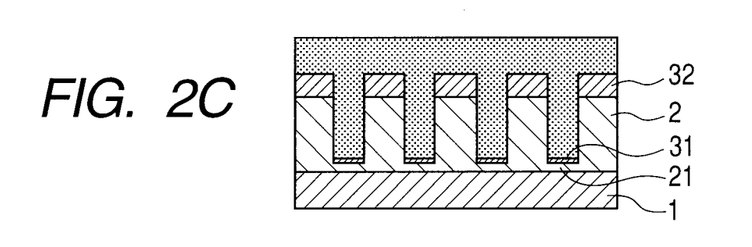

In the present example, the condition of conducting imprint was changed to two stages of steps (see FIGS. 2A to 2C). All of the composition, the condition and the like which were not described here were the same as those of Example 1.

Firstly, in the first step, a position of a mold was controlled so that the head of the mold could press only a portion corresponding to the film thickness of an absorption layer 3 (FIG. 2B).

After that, the mold was kept in the state for 1 minute as a retention period of time, and then the mold was pressed down to the final position as the second step (FIG. 2C).

After this, operations of releasing the mold, irradiating a light, stripping and developing the layers were conducted on the same conditions as in Example 1, and a fine structure equivalent to that of Example 1 was formed.

Example 6

In the present example, the layers were imprinted in the same two stages of steps as in Example 5, except for the condition of a press pressure.

In the first step, the layer was imprinted with a press pressure which was lowered to 30 MPa. In the second step, the layers were imprinted with a pressure of 70 MPa which was similar to that of Example 1.

As a result, a fine structure equivalent to that of Example 1 was formed.

Example 7

In the present example, the layers were imprinted in the same two stages of steps as in Example 5, except for the condition of a temperature.

In the first step, a substrate 1 was heated to the temperature of 120° C., and the layers were imprinted.

In the second step, the layers were imprinted at 150° C. which was the same condition as in Example 1. The substrate was cooled to 40° C. and a mold 4 was released.

As a result, a fine structure equivalent to that of Example 1 was formed.

Example 8

In the present example, the layers were imprinted in a similar way to that in Example 1, except for a used mold. A quartz mold was used as the mold. The quartz mold allows a Deep-UV light to pass therethrough when the whole surface of the layer is irradiated.

Figure 3:
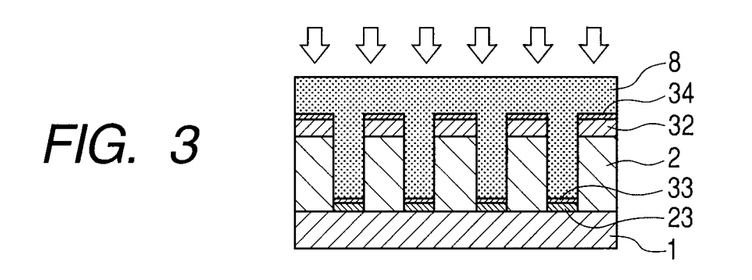
FIG. 3 is a schematic sectional view illustrating a basic embodiment of a method for forming a fine structure according to the present invention.

As is illustrated in FIG. 3, the whole surface was irradiated with the Deep-UV light in a state in which the quartz mold 8 pressed the layers before the mold was released. After that, the mold was released from the layers, and a fine structure equivalent to that of Example 1 was formed.

Example 9

The present example shows a method for manufacturing an ink jet recording head as one example of a liquid discharge head.

Figure 5A:
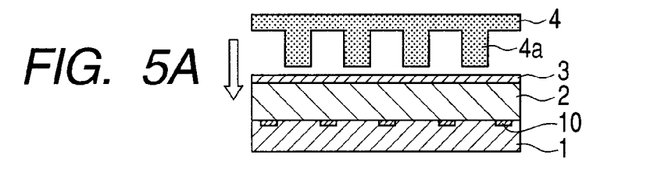
Figure 5B:
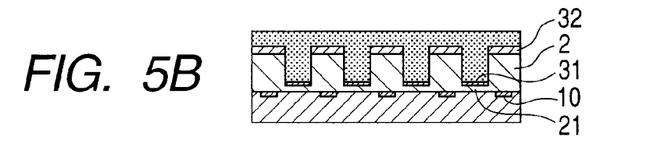
Figure 5C:
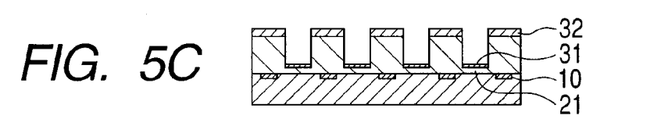
Figure 5D:
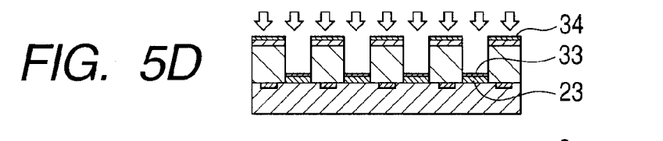
Figure 5F:
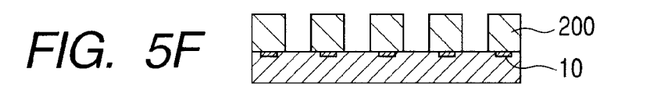

Firstly, in FIG. 5A, a substrate 1 has a heat resistant element 10 formed thereon as an energy-generating unit for discharging an ink recording liquid. Layers on the substrate 1 were imprinted with the same thermal imprint method as the method of Example 1, and a pattern was formed therein (FIGS. 5A to 5F which correspond to FIGS. 1A to 1F). The material composition, the process condition and the like used at this time were the same as those in Example 1.

Figure 5G:
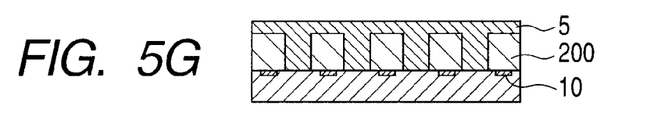

Next, a structure 200 which was obtained by a method for manufacturing a structure of one example in the present invention was used as a mold member 200 for a flow channel, which functions as a mold for the flow channel of ink, as is illustrated in FIG. 5G. A surface of a structure 200 was covered with a photo-curing-type photosensitive resin layer 5. The resin consisting of the composition shown in Table 1 was used for the photo-curing-type photosensitive resin layer 5.

TABLE 1

| Composition | parts by weight |
|---|---|
| EHPE-3150 (made by Daicel Chemical Industries, Ltd.) | 100 parts |
| A-187 (made by Nippon Unicar Company Limited) | 5 parts |
| Copper triflate | 0.5 parts |
| SP-170 (made by Asahi Denka Co., Ltd.) | 0.5 parts |
| Methyl isobutyl ketone | 100 parts |
| Xylene | 100 parts |

Figure 5H:
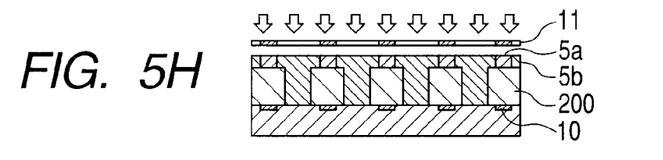

Next, the photo-curing-type photosensitive resin layer 5 was irradiated with UV by using a photomask 11, as is illustrated in FIG. 5H. For irradiation, a mask aligner MPA-600Super made by Canon Inc. was used, and the photo-curing-type photosensitive resin layer 5 was irradiated with the UV of 1 J/cm$^2$. An exposed portion 5b was cured, and an unexposed portion 5a was not cured.

Figure 5I:
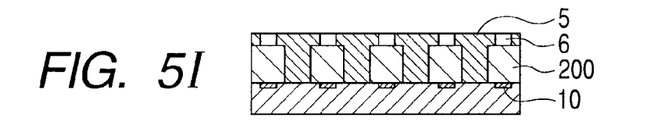

Next, the unexposed portion 5a was post-baked at 90° C., and was removed by being developed with a mixture liquid of methyl isobutyl ketone and xylene with the use of a coater developer CDS-630 made by Canon Inc. Thus, an ink discharge port 6 was formed, as is illustrated in FIG. 5I.

Figure 5J:
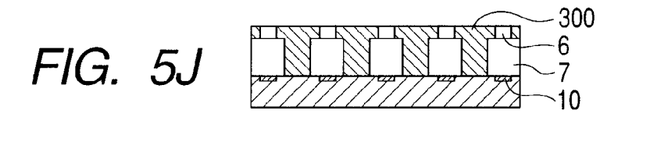

After this, as is illustrated in FIG. 5J, a supply port for supplying ink was formed (not shown), the mold member 200 for the flow channel was removed, the flow channel 7 for the ink was formed, and the ink jet recording head was produced.

In the ink jet recording head which was produced in the present example, the photo-curing-type photosensitive resin becomes a wall member 300 of the flow channel of the ink jet recording head. A portion at which this wall member 300 of the flow channel comes in contact with the substrate 1 corresponds to a portion in which a residual film is formed when a positive-type photosensitive resin layer 2 is imprinted. The method for forming the mold member 200 for the flow channel in the present invention can surely remove the residual film, and accordingly an ink jet recording head having superior adhesiveness between the wall member of the flow channel and the substrate can be obtained.

Example 10

The present example shows one example of a method for manufacturing an ink jet recording head which is similar to that in Example 9. Firstly, the steps from FIG. 5A to FIG. 5G were conducted in a similar way to those of Example 9.

Figure 6A:
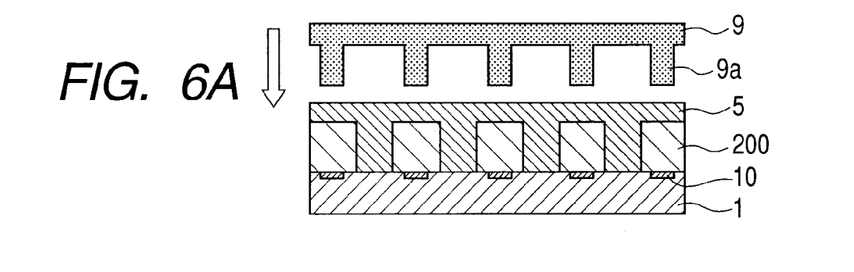
FIGS. 6A, 6B, 6C and 6D are schematic sectional views illustrating a basic embodiment of a method for manufacturing an ink jet recording head according to the present invention.
Figure 6B:
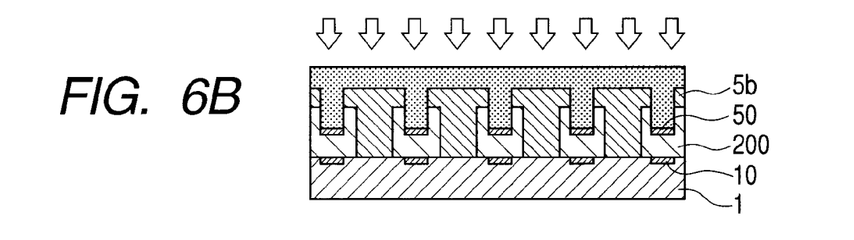

Subsequently, in FIG. 6A, SU8-3010 (trade name) made by Kayaku MicroChem Corporation was used as a photo-curing-type photosensitive resin 5. Then, as is illustrated in FIG. 6B, the photo-curing-type photosensitive resin 5 was imprinted with the use of a quartz mold 9 which is optically transparent and has a salient shape 9a in a portion that corresponds to an ink discharge port. Subsequently, the photo-curing-type photosensitive resin 5 was irradiated with a UV light. The photo-curing-type photosensitive resin 5 was irradiated with the UV light of 1 J/cm$^2$ by using MPA-600Super, and was post-baked at 95° C.

Figure 6C:
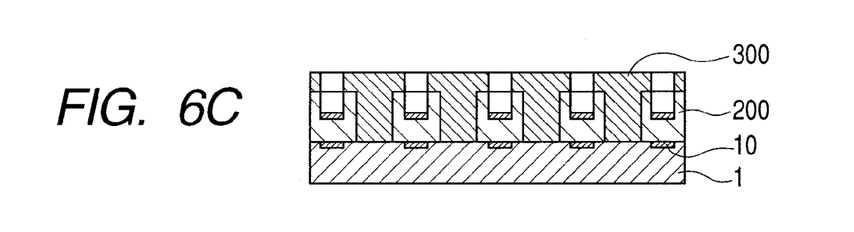

Then, the quartz mold 9 was released, and an ink discharge port 6 was formed as is illustrated in FIG. 6C. At this time, a residual film 50 of the photo-curing-type photosensitive resin 5 (here, SU-8) which was formed by imprinting remains there in a form of being pressed into the inner portion of a mold member 200 (which is polymethyl isopropenyl ketone here) for a flow channel.

Figure 6D:
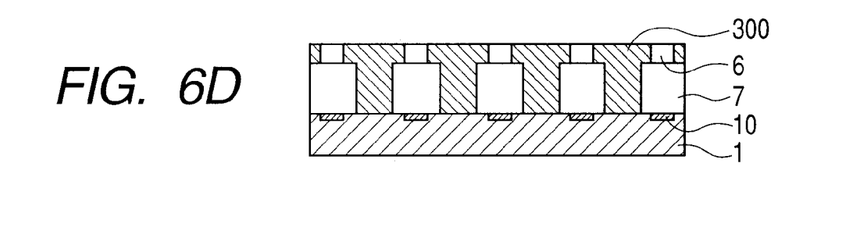

After this, in a similar way to that in Example 9, an ink supply port was formed (not shown), the mold member 200 for the flow channel was eluted, further the residual film 50 was removed from the ink supply port, thereby an ink flow channel 7 was formed, and the ink jet recording head was produced, as is illustrated in FIG. 6D.

At this time, the residual film 50 of the photo-curing-type photosensitive resin could be removed without remaining in the flow channel for ink, because the size of the residual film 50 was sufficiently smaller than that of an aperture of the ink supply port (not shown).

Example 11

When the photo-curing-type photosensitive resin 5 is irradiated with a UV light in FIG. 6B, a quartz mold which is selectively covered with a light-shielding film thereon can also be used as a quartz mold 9. In this case, if a metal light-shielding film such as Cr was provided on a portion which was a projecting portion of the quartz mold 9 and corresponded to an ink discharge port 6, a portion corresponding to the residual film 50 of the photo-curing-type photosensitive resin is not photo-cured. Accordingly, the residual film 50 can be removed without remaining in the flow channel for ink, in a similar way to that in Example 10.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-134075, filed Jun. 3, 2009, which is hereby incorporated by reference herein in its entirety.

What is claimed is:

1. A method for manufacturing a structure, the method comprising in the following order:
   preparing a substrate having a positive-type photosensitive resin layer and an absorption layer stacked thereon in this order, the absorption layer capable of absorbing a light having a photosensitive wavelength which the positive-type photosensitive resin senses;
   pressing a projecting portion of a mold having the projecting portion into two layers of the positive-type photosensitive resin layer and the absorption layer;
   separating the mold from the two layers;
   irradiating the two layers with the light from an upper face side of the two layers;
   removing the absorption layer; and
   developing the positive-type photosensitive resin layer.

2. The method according to claim 1, wherein a recess portion is formed, after the mold has been separated from the two layers, in a direction toward the substrate from a top surface of the positive-type photosensitive resin layer, and the thickness of the absorption layer on the top surface thereof is thicker than that of the absorption layer in the recess portion.

3. The method according to claim 1, wherein the absorption layer includes a positive-type photosensitive resin.

4. The method according to claim 2, wherein the absorption layer contains a novolak resin and a naphthoquinone diazide derivative.

5. The method according to claim 1, wherein the pressing includes thermal imprinting in which the two layers are pressed with at least the substrate being heated.

6. A method for manufacturing a structure, the method comprising in the following order:
   preparing a substrate having a positive-type photosensitive resin layer and an absorption layer stacked thereon in this order, the absorption layer capable of absorbing a light having a photosensitive wavelength which the positive-type photosensitive resin senses;
   pressing a projecting portion of a mold which has the projecting portion and allows the light to pass therethrough into two layers of the positive-type photosensitive resin layer and the absorption layer;
   allowing the light to pass through the mold and irradiate the two layers with the light in a state in which the mold comes in contact with the two layers;
   removing the absorption layer; and
   developing the positive-type photosensitive resin layer.

7. The method according to claim 6, wherein a recess portion is formed in a direction toward the substrate from a top surface of the positive-type photosensitive resin layer because the mold has pressed into the two layers, and the thickness of the absorption layer on the top surface thereof is thicker than that of the absorption layer in the recess portion.

8. A method for manufacturing a liquid discharge head having a substrate provided with an energy-generating element which generates energy to be used for discharging a liquid and a wall member of a flow channel of the liquid, the flow channel communicating with a discharge port of the liquid, the method comprising:
- preparing the substrate having a positive-type photosensitive resin layer for forming a mold member for the flow channel and an absorption layer stacked thereon in this order, the absorption layer capable of absorbing a light having a photosensitive wavelength which the positive-type photosensitive resin senses;
- pressing a projecting portion of a mold having the projecting portion into two layers of the positive-type photosensitive resin layer and the absorption layer;
- separating the mold from the two layers;
- irradiating the two layers with the light from an upper face side of the two layers;
- removing the absorption layer;
- developing the positive-type photosensitive resin layer to form the mold member for the flow channel;
- providing a coating layer which becomes the wall member of the flow channel so as to cover the mold member of the flow channel;
- providing the discharge port in the coating layer; and
- removing the mold member of the flow channel to form the flow channel.

* * * * *